US008377723B2

(12) United States Patent
Nagai et al.

(10) Patent No.: US 8,377,723 B2
(45) Date of Patent: Feb. 19, 2013

(54) METHOD OF MANUFACTURING THIN-FILM TRANSISTOR SUBSTRATE

(75) Inventors: Hisao Nagai, Osaka (JP); Eiichi Satoh, Osaka (JP); Toshiyuki Aoyama, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/337,601

(22) Filed: Dec. 27, 2011

(65) Prior Publication Data
US 2012/0094403 A1 Apr. 19, 2012

Related U.S. Application Data

(63) Continuation of application No. PCT/JP2011/003009, filed on May 30, 2011.

(30) Foreign Application Priority Data

Jun. 4, 2010 (JP) ................................. 2010-128871

(51) Int. Cl.
*H01L 33/16* (2010.01)
(52) U.S. Cl. .................................. 438/16; 257/E21.529
(58) Field of Classification Search .................... 438/16, 438/706, 149, 158, 478; 257/E21.414, E21.529
See application file for complete search history.

(56) References Cited

U.S. PATENT DOCUMENTS
2009/0181545 A1 * 7/2009 Negishi et al. ................ 438/710

FOREIGN PATENT DOCUMENTS

| JP | 05-063196 | 3/1993 |
|----|-----------|--------|
| JP | 08-088371 | 4/1996 |
| JP | 2001-339066 | 12/2001 |
| JP | 2003-234288 | 8/2003 |

OTHER PUBLICATIONS

A.T. Hatzopoulos et al., "Stability of Amorphous-Silicon and Nanocrystalline Silicon Thin-Film Transistors Under DC and AC Stress", IEEE Electron Device Letters, vol. 28, No. 9, Sep. 2007, pp. 803-805.
International Search Report of PCT/JP2011/003009, dated Aug. 16, 2011.

* cited by examiner

*Primary Examiner* — Fernando L Toledo
*Assistant Examiner* — Peter Bradford
(74) *Attorney, Agent, or Firm* — Greenblum & Bernstein, P.L.C.

(57) ABSTRACT

Provided is a method of manufacturing a TFT substrate for preventing characteristics of a native oxide layer in a boundary between a microcrystal semiconductor layer and an amorphous semiconductor layer from being degraded. The method includes forming a gate electrode, forming a gate insulating film, modifying the formed first amorphous silicon thin film into a first crystalline silicon thin film, removing a silicon oxide layer on the surface of the first crystalline silicon thin film, forming the second amorphous silicon thin film, and dry etching the first crystalline silicon thin film and the second amorphous silicon thin film, and it is determined whether or not the in-process TFT substrate after the dry etching is returned to the processes after the dry etching by measuring the emission intensity of radicals in plasma during the dry etching and detecting the presence or absence of the silicon oxide layer in the boundary.

11 Claims, 13 Drawing Sheets

METHOD OF MANUFACTURING THIN-FILM TRANSISTOR SUBSTRATE

CROSS REFERENCE TO RELATED APPLICATION

This is a continuation application of PCT Patent Application No. PCT/JP2011/003009 filed on May 30, 2011, designating the United States of America, which is based on and claims priority of Japanese Patent Application No. 2010-128871 filed on Jun. 4, 2010. The entire disclosures of the above-identified applications, including the specifications, drawings and claims are incorporated herein by reference in their entirety.

BACKGROUND OF THE INVENTION (1) Field of the Invention

The present invention relates to a method of manufacturing a thin-film transistor (TFT) substrate that drives an active matrix liquid crystal display device and an organic electroluminescence (EL) display device, and in particular, to a method of manufacturing a thin-film transistor substrate including a channel layer with a bilayer structure of a microcrystal semiconductor layer and an amorphous semiconductor layer.

(2) Description of the Related Art

In recent years, organic EL display devices using organic EL elements are attracting attention, as one type of next-generation flat panel displays that replace liquid crystal display devices. The organic EL display devices are current-driven devices and different from voltage-driven liquid crystal display devices. In order to use the organic EL display devices as active matrix display devices, TFTs included in driving circuit boards that drive organic EL elements need to have superior ON/OFF characteristics.

Conventionally, TFT substrates that are driving circuits of liquid crystal display devices have a single-layer structure of a channel layer made of an amorphous semiconductor or a polycrystalline semiconductor. Since the TFTs having the single-layer structure of the channel layer made of the amorphous semiconductor have a wide band-gap and thus have a lower OFF-state current, they have a problem of having a lower ON-state current due to low mobility.

On the other hand, since the TFTs having the single-layer structure of the channel layer made of the polycrystalline semiconductor have a higher ON-state current due to high mobility unlike the TFT substrates having the single-layer structure of the channel layer made of the amorphous semiconductor, they have a problem of having a higher OFF-state current due to defects and the grain boundary in the polycrystalline semiconductor.

In order to solve these problems, a thin-film semiconductor device including a channel layer with a bilayer structure of a polycrystalline semiconductor layer and an amorphous semiconductor layer is suggested (for example, see Hatzopoulos et al., IEEE ELECTRON DEVICE LETTERS, VOL 28, NO. 9, SEPTEMBER 2007). It is said that since the advantages of both of the polycrystalline semiconductor layer and the amorphous semiconductor layer in the bilayer structure mutually work, ideally the following characteristics can be obtained: the ON-state current of the channel layer with the bilayer structure is higher than that of the single-layered channel layer made of the amorphous semiconductor, and the OFF-state current of the channel layer with the bilayer structure is lower than that of the single-layered channel layer made of the polycrystalline semiconductor.

However, Japanese Unexamined Patent Application Publication No. 8-088371 discloses the slight appearance of oxide silicon (SiOx) and an impurity-doped layer due to contamination, in a boundary between an intrinsic semiconductor layer and an impurity-doped semiconductor layer and a boundary between an impurity-doped semiconductor layer and source, and drain electrodes. The impurity-doped layer increases a contact resistance, and particularly degrades the current when the drain voltage is low. Thus, a problem occurs: the characteristics of the drain current with respect to the drain voltage, that is, the ohmic characteristics in a channel region are degraded. When such a TFT with the degraded ohmic characteristics is used as a switching element that is a display driving means for a liquid crystal display device, gradation defects appear in data lines, which may cause point defects on a display device.

Even when a TFT substrate includes a channel layer with the bilayer structure of the polycrystalline semiconductor layer and the amorphous semiconductor layer, an unintended native oxide layer is formed in a boundary between the polycrystalline semiconductor layer and the amorphous semiconductor layer, due to differences in manufacturing processes between these layers, as formed in the boundary between the intrinsic semiconductor layer and the impurity-doped semiconductor layer. For example, when a lower semiconductor layer is modified into a polycrystalline semiconductor layer with laser irradiation or annealing, since the lower semiconductor layer is exposed to air, the native oxide layer is formed on the surface of the in-process lower semiconductor layer. Furthermore, even a TFT substrate with a bilayer structure of Channel Etching Stopper (CES) layers needs to come in contact with air, and the native oxide layer is formed between the layers. Accordingly, the transistor characteristics, such as the ON-state current, are degraded, and the display quality decreases.

The examples of a process of removing the native oxide layer in a boundary between the polycrystalline semiconductor layer and the amorphous semiconductor layer included in the channel layer includes exposing the surface of the polycrystalline semiconductor layer to hydrogen plasma or argon plasma after forming the polycrystalline semiconductor layer and immediately before forming the amorphous semiconductor layer.

However, although the process of removing the native oxide layer produces a certain advantage, it is difficult to check the remaining state of the native oxide layer during the removing process and evaluate it. Furthermore, checking the remaining state of the native oxide layer after the removing process is not appropriate.

Furthermore, excessive exposure of the surface of the polycrystalline semiconductor layer to hydrogen plasma or argon plasma in view of the incapability of checking the remaining state of the native oxide layer during the removing process causes the semiconductor layer and the CES layers to be peeled off and produces the negative impact on the characteristics, such as amorphization on the surface of the semiconductor layer and degradation in the CES layers.

On the other hand, when the native oxide layer remains due to the incapability of checking the remaining state of the native oxide layer during the removing process, the rate of a post-process of insularly etching the semiconductor layers with the bilayer structure varies, the timing to stop the etching becomes instable, and the TFTs becomes non-uniform.

As described above, the semiconductor characteristics are further degraded with the remaining native oxide layer and the excessive removing process, and a TFT substrate with such semiconductor characteristics becomes a defective part. As a result, problem arises, such as decrease in the yield and higher manufacturing cost.

The present invention has been conceived in view of the problems, and has an object of providing a method of manufacturing a TFT substrate including a channel layer with a bilayer structure of a polycrystalline semiconductor layer and an amorphous semiconductor layer in order not to degrade the characteristics of the transistors without checking the remaining state of a native oxide layer in a boundary between the two semiconductor layers during removing the native oxide layer.

SUMMARY OF THE INVENTION

In order to achieve the object, a method of manufacturing a thin-film transistor (TFT) substrate includes: preparing a substrate; forming a gate electrode on the substrate; forming a gate insulating film on the gate electrode and on a region of the substrate on which the gate electrode is not formed; forming a first amorphous silicon thin film on the gate insulating film; modifying the first amorphous silicon thin film into a first crystalline silicon thin film, by crystallizing at least a region of the first amorphous silicon thin film, the region being an upper region of the gate electrode; removing a silicon oxide layer on a surface of the first crystalline silicon thin film by (i) placing the in-process TFT substrate after the modifying, in a dry etching apparatus and (ii) dry etching the surface of the first crystalline silicon thin film; forming a second amorphous silicon thin film on the first crystalline silicon thin film; forming a photoresist on the second amorphous silicon thin film; patterning the photoresist so that a region of the photoresist corresponding to the upper region of the gate electrode remains; and patterning the first crystalline silicon thin film and the second amorphous silicon thin film by dry etching using, as a mask, the photoresist remaining in the patterning of the photoresist, wherein during the time when the first crystalline silicon thin film and the second amorphous silicon thin film are dry etched in the patterning of the first crystalline silicon thin film and the second amorphous silicon thin film, presence or absence of the silicon oxide layer in a boundary between the first crystalline silicon thin film and the second amorphous silicon thin film is detected by measuring an emission intensity of predetermined radicals in plasma for the dry etching, and (i) when the presence of the silicon oxide layer is detected, it is determined that the in-process TFT substrate after the patterning of the first crystalline silicon thin film and the second amorphous silicon thin film cannot proceed to other processes subsequent to the patterning of the first crystalline silicon thin film and the second amorphous silicon thin film, and (ii) when the absence of the silicon oxide layer is detected, it is determined that the in-process TFT substrate after the patterning of the first crystalline silicon thin film and the second amorphous silicon thin film can proceed to the other processes.

Since an amount of a native oxide layer is estimated and a conforming TFT substrate is determined using waveforms of an End Point Monitor (EPM) used in the dry etching process for islanding semiconductor layers according to the method of manufacturing a TFT substrate in the present invention, the TFT substrate in which the native oxide layer remains can be passed to the repairing process. Thus, the semiconductor characteristics can be prevented from being degraded, and only the conforming TFT substrate having no native oxide layer can proceed to the post-processes. As a result, the yield will not be degraded, and the manufacturing cost can be suppressed.

BRIEF DESCRIPTION OF THE DRAWINGS

These and other objects, advantages and features of the invention will become apparent from the following description thereof taken in conjunction with the accompanying drawings that illustrate a specific embodiment of the present invention. In the Drawings.

DESCRIPTION OF THE PREFERRED EMBODIMENT

Figure 1:
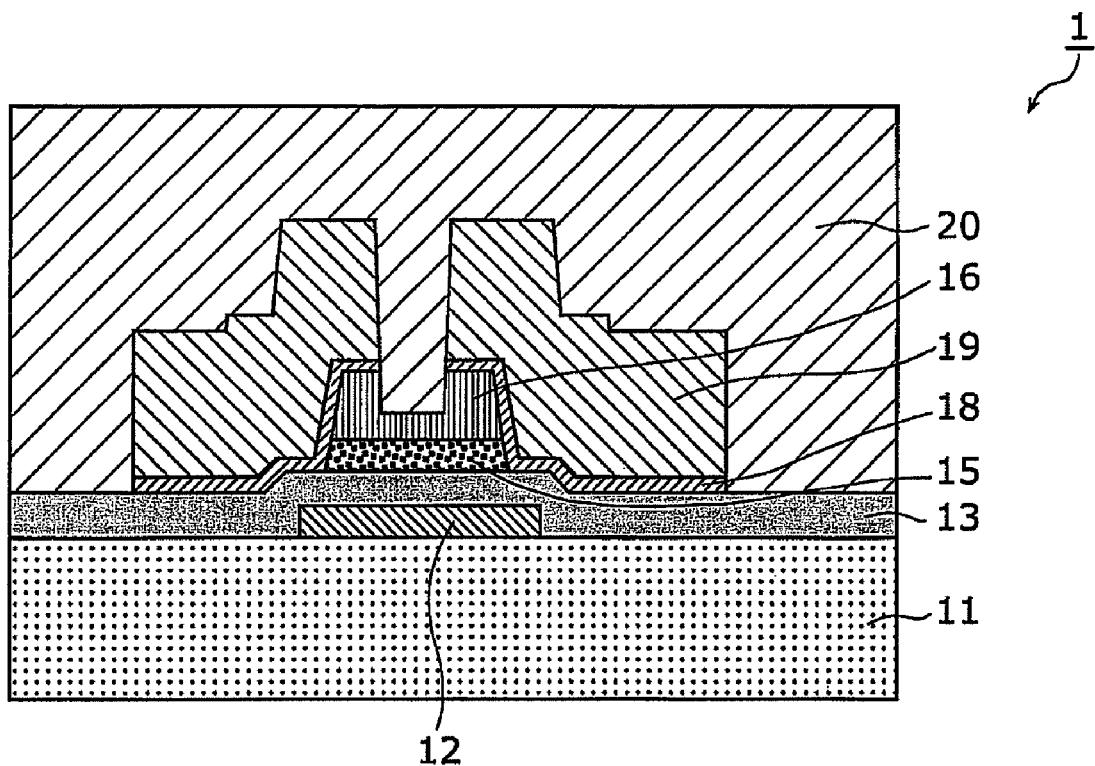
FIG. 1 schematically illustrates a cross-sectional view of a TFT substrate according to an embodiment.

The method of manufacturing a thin-film transistor (TFT) substrate according to an aspect of the present invention includes: preparing a substrate; forming a gate electrode on the substrate; forming a gate insulating film on the gate electrode and on a region of the substrate on which the gate electrode is not formed; forming a first amorphous silicon thin film on the gate insulating film; modifying the first amorphous silicon thin film into a first crystalline silicon thin film, by crystallizing at least a region of the first amorphous silicon thin film, the region being an upper region of the gate electrode; removing a silicon oxide layer on a surface of the first crystalline silicon thin film by (i) placing the in-process TFT substrate after the modifying, in a dry etching apparatus and (ii) dry etching the surface of the first crystalline silicon thin film; forming a second amorphous silicon thin film on the first crystalline silicon thin film; forming a photoresist on the second amorphous silicon thin film; patterning the photoresist so that a region of the photoresist corresponding to the upper region of the gate electrode remains; and patterning the first crystalline silicon thin film and the second amorphous silicon thin film by dry etching using, as a mask, the photoresist remaining in the patterning of the photoresist, wherein during the time when the first crystalline silicon thin film and the second amorphous silicon thin film are dry etched in the patterning of the first crystalline silicon thin film and the second amorphous silicon thin film, presence or absence of the silicon oxide layer in a boundary between the first crystalline silicon thin film and the second amorphous silicon thin film is detected by measuring an emission intensity of predetermined radicals in plasma for the dry etching, and (i) when the presence of the silicon oxide layer is detected, it is determined that the in-process TFT substrate after the patterning of the first crystalline silicon thin film and the second amorphous silicon thin film cannot proceed to other processes subsequent to the patterning of the first crystalline silicon thin film and the second amorphous silicon thin film, and (ii) when the absence of the silicon oxide layer is detected, it is determined that the in-process TFT substrate after the patterning of the first crystalline silicon thin film and the second amorphous silicon thin film can proceed to the other processes.

In a TFT with a channel layer including a stack of a crystalline silicon thin film and an amorphous silicon film, with the presence of the silicon oxide layer in the boundary between the crystalline silicon thin film and the amorphous silicon film, charges are accumulated in the silicon oxide layer, and mobility properties and on-characteristics of careers that move the channel layer with the charges are degraded.

The amorphous silicon film that is a source of the crystalline silicon film is formed by a vacuum thin film coating system, temporally is exposed to air, and then is crystallized by, for example, a laser beam to form the crystalline silicon film. Thus, the silicon oxide layer is formed on the surface of the crystallized silicon film.

In the conventional technique, the silicon oxide layer is removed in the vacuum thin film coating system for forming the amorphous silicon film, using plasma, such as hydrogen plasma and argon plasma, after forming the crystalline silicon film and immediately before forming the amorphous silicon film on the crystalline silicon film.

However, since the amorphous silicon film that is an upper layer is formed immediately after the etching in the conventional technique, it is difficult to check whether or not the silicon oxide layer can be removed, after the amorphous silicon film is formed.

Furthermore, since it is difficult to accurately control the etching conditions, when the crystalline silicon film that is a lower layer is excessively etched, the film quality of the crystalline silicon film is degraded. Thus, it is difficult to form a TFT with favorable characteristics. As a result, the manufacturing yield of the TFT will decrease.

According to the aspect of the present invention, the presence or absence of the silicon oxide layer in the boundary is detected by measuring an intensity of an emission spectrum of radicals in the plasma for the dry etching, and whether or not the in-process TFT substrate after the patterning of the first crystalline silicon thin film and the second amorphous silicon thin film can proceed to the processes is determined according to a result of the detection.

Furthermore, since the presence or absence of the silicon oxide layer in the boundary can be detected, the state of removing the silicon oxide layer in the removing can be determined. As a result, the TFT substrate in which the silicon oxide layer is removed and which includes the high-quality first crystalline silicon thin film and second amorphous silicon thin film can be sorted and the TFT substrate with higher manufacturing yield can be manufactured.

The method according to the aspect of the present invention may include stopping dry etching the first crystalline silicon thin film and the second amorphous silicon thin film, and repairing the in-process TFT substrate, when the presence of the silicon oxide layer is detected in the patterning of the first crystalline silicon thin film and the second amorphous silicon thin film.

Accordingly, the TFT substrate having no silicon oxide layer and including the high-quality first crystalline silicon thin film and second amorphous silicon thin film can be manufactured by sorting the TFT substrate with the silicon oxide layer during the patterning of the first crystalline silicon thin film and the second amorphous silicon thin film in the manufacturing processes, and re-forming the first crystalline silicon thin film and second amorphous silicon thin film.

The method according to the aspect of the present invention may include returning the in-process TFT substrate to the removing of a silicon oxide layer, and performing again, on the in-process TFT substrate, (i) the removing of a silicon oxide layer, (ii) the forming of a second amorphous silicon thin film, (iii) the forming of a photoresist, (iv) the patterning of the photoresist, and (v) the patterning of the first crystalline silicon thin film and the second amorphous silicon thin film, when the in-process TFT substrate exposes the first crystalline silicon thin film in the repairing, wherein the repairing may include: removing the photoresist patterned in the patterning of the photoresist so as to expose the second amorphous silicon thin film; and removing the exposed second amorphous silicon thin film so as to expose the first crystalline silicon thin film.

According to the aspect of the present invention, when the presence of the silicon oxide layer in a boundary between the first crystalline silicon thin film and the second amorphous silicon thin film is detected, the dry etching is stopped upon the detection, and the in-process TFT substrate after the repairing process in which the surface of the first crystalline silicon thin film has been exposed proceeds to the removing and the subsequent processes.

Since the TFT substrate on which the gate electrode, the gate insulating film, and the first crystalline silicon thin film are formed can be reused with the repairing process, the TFT substrate with higher manufacturing yield can be manufactured.

The method according to the aspect of the present invention may further include returning the in-process TFT substrate to the forming of a first amorphous silicon thin film, and performing again, on the in-process TFT substrate, (i) the forming of a first amorphous silicon thin film, (ii) the modifying, (iii) the removing of a silicon oxide layer, (iv) the forming of a second amorphous silicon thin film, (v) the forming of a photoresist, and (vi) the patterning of the photoresist, when the in-process TFT substrate exposes the gate insulating film in the repairing, wherein the repairing may include: removing the photoresist patterned in the patterning of the photoresist so as to expose the second amorphous silicon thin film; and removing the exposed second amorphous silicon thin film and the first crystalline silicon thin film so as to expose the gate insulating film.

According to the aspect of the present invention, when the presence of the silicon oxide layer in the boundary between the first crystalline silicon thin film and the second amorphous silicon thin film is detected, the dry etching is stopped upon the detection, and the in-process TFT substrate after the repairing process in which the surface of the gate insulating film has been exposed proceeds to the forming of a first amorphous silicon thin film and the subsequent processes.

Since the TFT substrate on which the gate electrode and the gate insulating film are formed can be reused with the repairing process, the TFT substrate with higher manufacturing yield can be manufactured.

In the method according to the aspect of the present invention, manufacturing conditions of the forming of a second amorphous silicon thin film and processes prior to the forming of a second amorphous silicon thin film may be adjusted, when the presence of the silicon oxide layer is detected in the patterning of the first crystalline silicon thin film and the second amorphous silicon thin film.

Accordingly, the yield of manufacturing a conforming TFT substrate having no native oxide layer in the boundary can be improved without the repairing process, and the manufacturing cost can be suppressed.

The method according to the aspect of the present invention may include discarding the in-process TFT substrate when the presence of the silicon oxide layer is detected in the patterning of the first crystalline silicon thin film and the second amorphous silicon thin film.

Accordingly, only the conforming TFT substrate having no native oxide layer can proceed to the post-processes. As a result, the yield will not be degraded, and the manufacturing cost can be suppressed.

In the method according to the aspect of the present invention, the predetermined radicals may (i) be present in the plasma for the dry etching in the patterning of the first crystalline silicon thin film and the second amorphous silicon thin film and (ii) etch the second amorphous silicon thin film.

The predetermined radicals in the patterning of the first crystalline silicon thin film and the second amorphous silicon thin film etch the second amorphous silicon thin film, silicon in the second amorphous silicon thin film consumes the radicals during the etching of the second amorphous silicon thin film, and an amount of the radicals in the plasma is reduced. As a result, the emission intensity of the radicals during the period is smaller. However, when etching of the second amorphous silicon thin film ends and the silicon oxide layer remains on the surface of the first crystalline silicon thin film, the amount of consumed radicals is reduced, and thus the amount of the radicals in the plasma is increased. As a result, the emission intensity of the radicals during the period is larger.

In other words, assuming the predetermined radicals as radicals that etch the second amorphous silicon thin film in the plasma for the dry etching in the patterning of the first crystalline silicon thin film and the second amorphous silicon thin film, the presence or absence of the silicon oxide layer in the boundary between the first crystalline silicon thin film and the second amorphous silicon thin film can be determined with high precision by measuring a behavior of the radicals.

In the method according to the aspect of the present invention, the predetermined radicals may include a halogen element.

The halogen element has a high etching rate, and the radicals of the halogen element have a higher intensity of the emission spectrum.

According to the aspect of the present invention, change in the emission intensity can be detected with high precision.

In the method according to the aspect of the present invention, the halogen element may be one of Cl and F.

According to the aspect of the present invention, the halogen element may be one of Cl and F.

In the method according to the aspect of the present invention, wherein during the dry etching in the patterning of the first crystalline silicon thin film and the second amorphous silicon thin film, an intensity of an emission spectrum of the radicals that (i) are present in the plasma for the dry etching and (ii) etch the second amorphous silicon thin film may be measured, a secondary differential coefficient of the intensity of the emission spectrum during a predetermined period may be calculated, and the presence of the silicon oxide layer may be determined when the calculated secondary differential coefficient is larger than 0.

Since the presence of the silicon oxide layer can be detected earlier according to the aspect of the present invention, the in-process TFT substrate after the patterning of the first crystalline silicon thin film and the second amorphous silicon thin film can be passed to the repairing process earlier.

Furthermore, the first crystalline silicon thin film of the in-process TFT substrate that is passed to the repairing process can be prevented from being etched. When the surface of the first crystalline silicon thin film is etched, the surface is amorphized and the characteristics of the first crystalline silicon thin film that functions as a channel layer, such as the mobility, are degraded. Thus, the etching is not preferable. According to the aspect of the present invention, the in-process TFT substrate after the patterning of the first crystalline silicon thin film and the second amorphous silicon thin film can be passed to the repairing process, without etching the first crystalline silicon thin film. In such a case, the second amorphous silicon thin film may be re-formed after the repairing process without re-forming the first crystalline silicon thin film. Thus, the manufacturing processes can be simplified, and the TFT substrate with higher manufacturing yield can be manufactured.

Furthermore, the method according to the aspect of the present invention may include performing the other processes when the absence of the silicon oxide layer is detected in the patterning of the first crystalline silicon thin film and the second amorphous silicon thin film, wherein the other processes may include: forming a contact layer so as to cover the first crystalline silicon thin film, the second amorphous silicon thin film, and the gate insulating film, the first crystalline silicon thin film and the second amorphous silicon thin film being patterned in the patterning of the first crystalline silicon thin film and the second amorphous silicon thin film; forming, on the contact layer, a metal layer to be a pair of source and drain electrodes; placing, on the metal layer, a resist for forming the pair of source and drain electrodes from the metal layer; forming the pair of source and drain electrodes, by wet etching the metal layer using the resist until a surface of the contact layer is exposed; and dry etching the contact layer and the second amorphous silicon thin film between the pair of source and drain electrodes.

When the absence of the silicon oxide layer in the boundary between the first crystalline silicon thin film and the second amorphous silicon thin film is detected according to the aspect of the present invention, the post-processes after forming of the contact layer are performed. Accordingly, the TFT substrate in which the source electrode and the drain electrode are formed has no silicon oxide layer, and can be manufactured with higher manufacturing yield and high quality.

(Embodiment)

A thin-film transistor (TFT) substrate and a method of manufacturing the same according to an embodiment of the present invention will be hereinafter described with reference to the drawings.

FIG. 1 schematically illustrates a cross-sectional view of a TFT substrate 1 according to the embodiment.

The TFT substrate 1 is a bottom-gate TFT substrate, and includes a substrate 11, a gate electrode 12 sequentially stacked on the substrate 11, a gate insulating film 13, semiconductor layers 15 and 16, a contact layer 18, a pair of source and drain electrodes 19, and a passivation film 20.

The substrate 11 is made of, for example, glass.

The gate electrode 12 is made of a metal, for example, molybdenum-tungsten (MoW), and is formed on the substrate 11. For example, the gate electrode 12 is formed by sputtering, and has a film thickness of 50 nm.

The gate insulating film 13 is made of, for example, oxide silicon (SiOx), silicon nitride (SiNy), and silicon oxynitride (SiOxNy), and is formed on the substrate 11 and the gate electrode 12 to cover the gate electrode 12. The gate insulating film 13 is formed by, for example, the plasma CVD method, and has a film thickness of 100 to 200 nm.

The semiconductor layer 15 is a first crystalline silicon thin film formed on the gate insulating film 13, and is made of a microcrystal silicon. The ON-state current of the TFT can be increased using the semiconductor layer 15 as one of constituent elements of a channel layer. The semiconductor layer 15 is formed by stacking a first amorphous silicon thin film on the gate insulating film 13 and then irradiating with laser or annealing the first amorphous silicon thin film. The first amorphous silicon thin film is formed by, for example, the plasma CVD method. Furthermore, the semiconductor layer 15 has a film thickness of 20 to 70 nm. Here, the microcrystalline silicon is defined as a silicon made of microcrystals each with an average crystal grain size of 20 nm to 50 nm. Furthermore, the semiconductor layer 15 may be made of polysilicons including crystals each with an average crystal grain size larger than that of the microcrystalline silicon.

The semiconductor layer 16 is a second amorphous silicon thin film formed on the semiconductor layer 15, is made of an amorphous silicon, and has a band-gap energy (Eg) larger than Eg of the semiconductor layer 15. Accordingly, the OFF-state current of the TFT can be reduced. For example, the semiconductor layer 16 has Eg of 1.8 eV, and the semiconductor layer 15 has Eg of 1.1 eV. The semiconductor layer 16 is formed by, for example, the plasma CVD method, and has a film thickness of, for example, 100 nm. Each of the semiconductor layers 15 and 16 functions as a channel layer of a field effect TFT.

The contact layer 18 has an n-type concentration higher than that of the semiconductor layer 16, and is, for example, an p-doped n+ amorphous silicon thin film. For example, the contact layer 18 is formed by the plasma CVD method, and has a film thickness of 30 nm.

The pair of source and drain electrodes 19 includes, on the surface of the contact layer 18, a source electrode and a drain electrode that are separated from each other. The pair of source and drain electrodes 19 is formed in (i) a single layer structure with, for example, a conductive material or an alloy or (ii) a multi layer structure with, for example, aluminum (Al), molybdenum (Mo), copper (Cu), molybdenum-tungsten (MoW), titanium (Ti), and chromium (Cr).

The passivation film 20 is made of, for example, silicon nitride (SiN), and has a function of blocking water vapor and oxygen from entering each of the lower layers in the TFT. Thus, it is possible to prevent each of the lower layers in the TFT from being degraded (oxidized) by exposure to water vapor and oxygen. The passivation film 20 is formed by, for example, the plasma CVD method, and has a film thickness of, for example, 200 to 400 nm.

In the process of manufacturing the TFT substrate 1, a native oxide layer is formed on the surface of the semiconductor layer 15. When the semiconductor layer 16 is formed with the native oxide layer remaining, the rate of insularly etching the semiconductor layers 15 and 16 that is a post-process varies, and the timing to stop the etching becomes instable, and the TFTs becomes non-uniform. Thus, the semiconductor characteristics are further degraded, and a TFT substrate with the degraded semiconductor characteristics becomes a defective part. As a result, problems arise, such as decrease in the yield and higher manufacturing cost.

In view of the above points, the processes of manufacturing the TFT substrate 1 includes a process of exposing the surface of the semiconductor layer 15 to hydrogen plasma without exposing it to air in the film deposition environment of the semiconductor layer 16 and removing the native oxide layer, after forming the semiconductor layer 15 and before forming the semiconductor layer 16.

Next, the method of manufacturing the TFT substrate according to the embodiment will be described. The method of manufacturing the TFT substrate according to the embodiment includes determining whether an in-process TFT substrate is defective or not during the process of forming the TFT substrate, and returning the in-process TFT substrate determined to be defective to a repairing process. Furthermore, the determining is performed during the time when the semiconductor layers are insularly etched.

Figure 2:
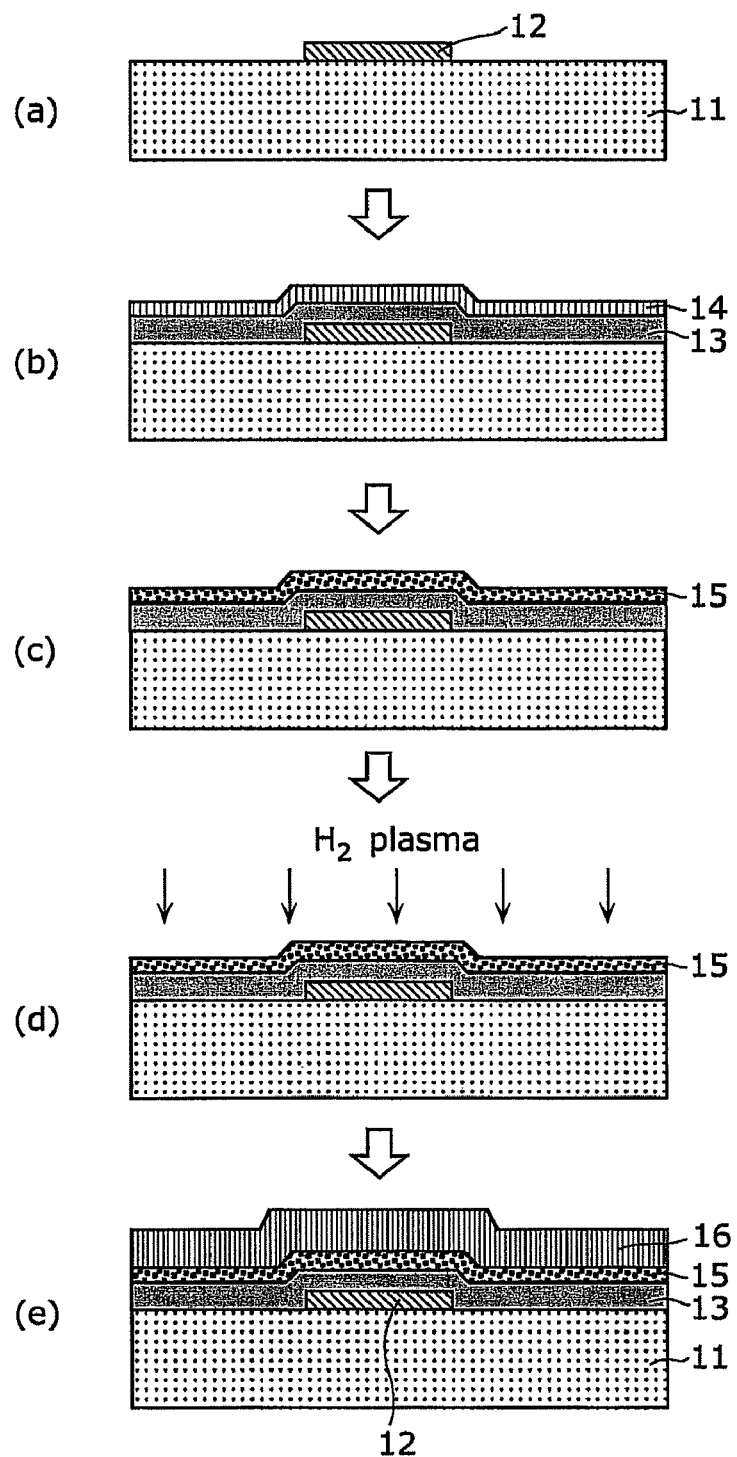
FIG. 2 schematically illustrates a cross-sectional view of a first process group in the method of manufacturing the TFT substrate according to the embodiment.
Figure 3:
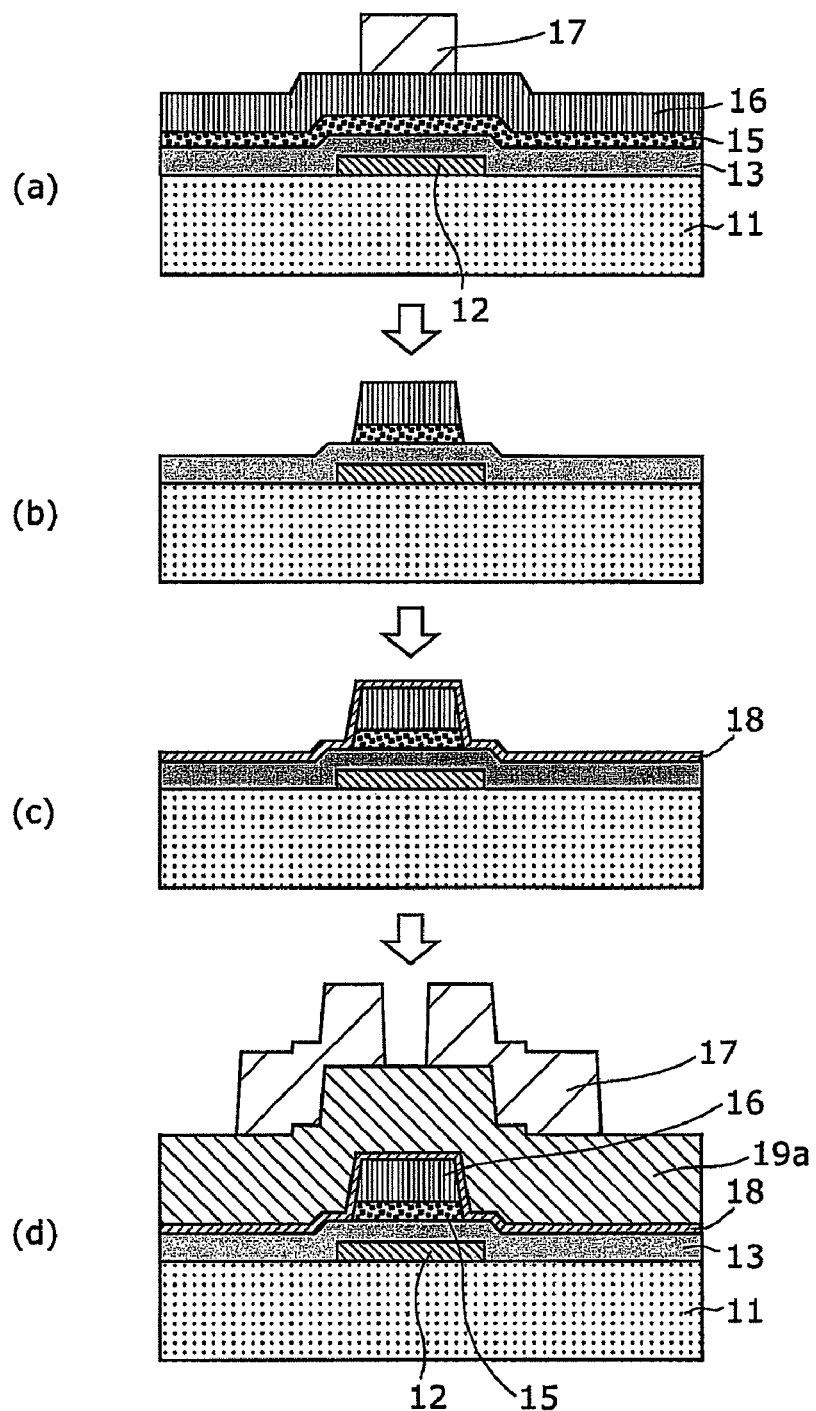
FIG. 3 schematically illustrates a cross-sectional view of a second process group in the method of manufacturing the TFT substrate according to the embodiment.
Figure 4:
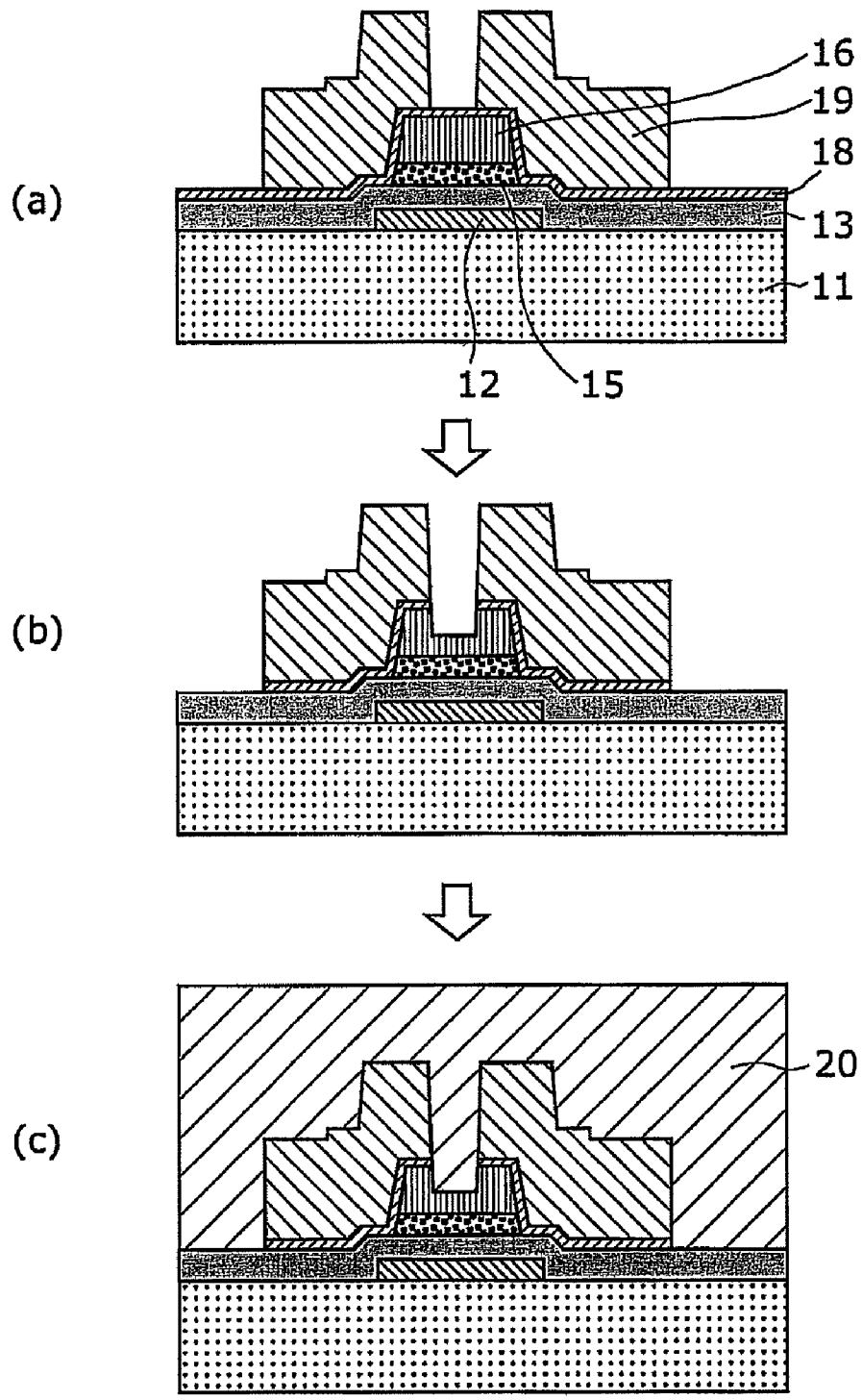
FIG. 4 schematically illustrates a cross-sectional view of a third process group in the method of manufacturing the TFT substrate according to the embodiment.

FIGS. 2 to 4 schematically illustrate a cross-sectional view of first, second, and third process groups in the method of manufacturing the TFT substrate according to the embodiment. The manufacturing method is sequentially performed from the first process group in FIG. 2(a) to (e) to the second process group in FIG. 3(a) to (d) and the third process group in FIG. 4(a) to (c).

Figure 5:
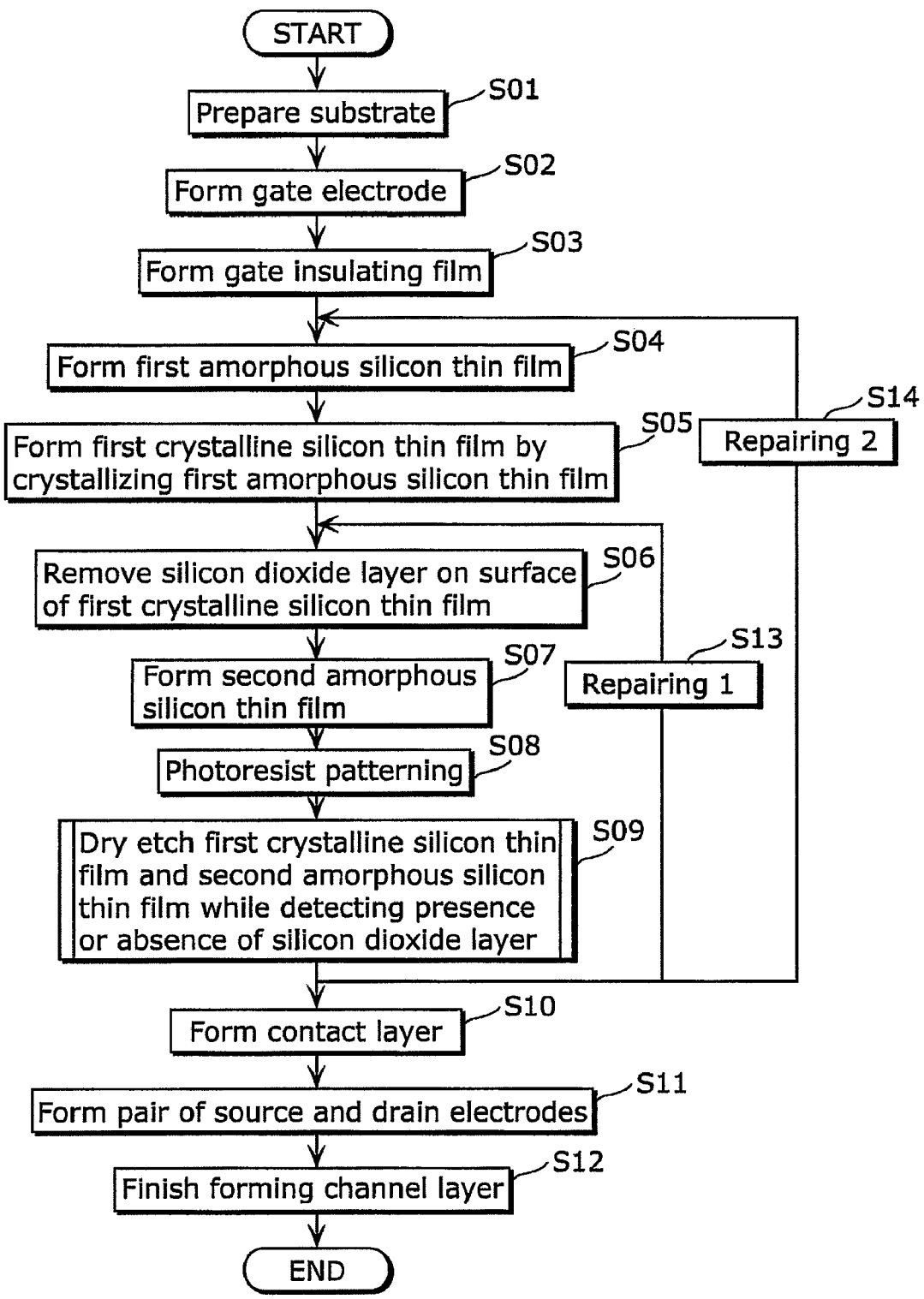
FIG. 5 illustrates a process flowchart of the method of manufacturing the TFT substrate according to the embodiment.

Furthermore, FIG. 5 illustrates the process flowchart of the method of manufacturing the TFT substrate according to the embodiment.

First, the substrate 11 is prepared (S01 in FIG. 5). The process S01 includes preparation processes, such as cleaning the substrate 11 and surface treatment on the substrate 11, and corresponds to the preparing.

Next, the gate electrode 12 is formed on the substrate 11 as illustrated in FIG. 2(a) (S02 in FIG. 5). The examples of the process of forming the gate electrode 12 include forming a metal layer on the substrate 11 by sputtering, and patterning the metal layer in a desired shape by wet etching the metal layer using a photoresist mask. The process S02 corresponds to the forming of a gate electrode.

Next, the gate insulating film 13 is formed on the gate electrode 12, and on a region on which the gate electrode is not formed and which is on the substrate 11, as illustrated in FIG. 2(b) (S03 in FIG. 5). For example, the plasma CVD method is used as a method of forming the gate insulating film 13. The process S03 corresponds to the forming of a gate insulating film.

Next, a semiconductor layer 14 made of amorphous silicon is formed on the gate insulating film 13 (S04 in FIG. 5). For example, the plasma CVD method is used as a method of forming the semiconductor layer 14. The process S04 corresponds to the forming of a first amorphous silicon thin film.

Preferably, the processes S03 and S04 are sequentially performed in the same vacuum chamber.

Next, the semiconductor layer 14 is modified into the semiconductor layer 15 made of microcrystalline silicon by crystallizing at least a region of the semiconductor layer 14 above the gate electrode 12 as illustrated in FIG. 2(c) (S05 in FIG. 5). The semiconductor layer 14 is irradiated with laser or annealed to crystallize the region above the gate electrode 12. The process S05 corresponds to the modifying.

Next, the silicon oxide layer on the surface of the semiconductor layer 15 is removed as illustrated in FIG. 2(d) (S06 in FIG. 5). For example, the surface of the semiconductor layer 15 is exposed to hydrogen plasma to remove the silicon oxide layer. It is preferred that the in-process TFT substrate is not exposed to air during a period between the hydrogen plasma exposing process and the process of forming the semiconductor layer 16 to be formed after the following processes, so that no silicon oxide layer that is a native oxide layer remains in a boundary between the semiconductor layer 15 and the semiconductor layer 16. The process S06 corresponds to the removing.

Then, the semiconductor layer 16 made of amorphous silicon is formed on the semiconductor layer 15 as illustrated in FIG. 2(e) (S07 in FIG. 5). For example, the plasma CVD method is used as a method of forming the semiconductor layer 16. The process S07 corresponds to the forming of a second amorphous silicon thin film.

Next, a photoresist 17 is formed on the surface of the semiconductor layer 16 that is an upper region of the gate electrode 12 as illustrated in FIG. 3(a) (S08 in FIG. 5). For example, the photoresist 17 is formed with photolithography. The process S08 corresponds to the forming of a photoresist and the patterning of the photoresist.

Then, the semiconductor layers 15 and 16 are patterned by dry etching using the photoresist 17 as a mask, as illustrated in FIG. 3(b) (S09 in FIG. 5). The process S09 corresponds to the patterning of the first crystalline silicon thin film and the second amorphous silicon thin film.

During the time when the semiconductor layers 15 and 16 are dry etched in the process S09, it is determined whether the in-process TFT substrate after the process S09 is passed to a repairing process by measuring the emission intensity of predetermined radicals in plasma for the dry etching and detecting the presence or absence of the silicon oxide layer in the boundary between the semiconductor layers 15 and 16.

Although the process S06 is a process of removing, using hydrogen plasma, the silicon oxide layer that is a native oxide layer, it is difficult during the process S06 to determine whether the silicon oxide layer is completely removed by the hydrogen plasma exposing process or the surface of the semiconductor layer 15 that is a foundation layer is not damaged.

Thus, in the method of manufacturing the TFT substrate according to the embodiment, when the semiconductor layers 15 and 16 are insularly etched in the process S09, the state of the boundary between the semiconductor layers 15 and 16 is monitored using an End Point Monitor (EPM). In other words, the remaining amount of the native oxide layer appearing in the boundary between the semiconductor layers with the stacked structure is detected during the insular etching process S09 to determine whether the in-process TFT substrate is defective or not. The process S09 that is an essential part of the manufacturing method of the present invention will be hereinafter described in detail.

Figure 6:
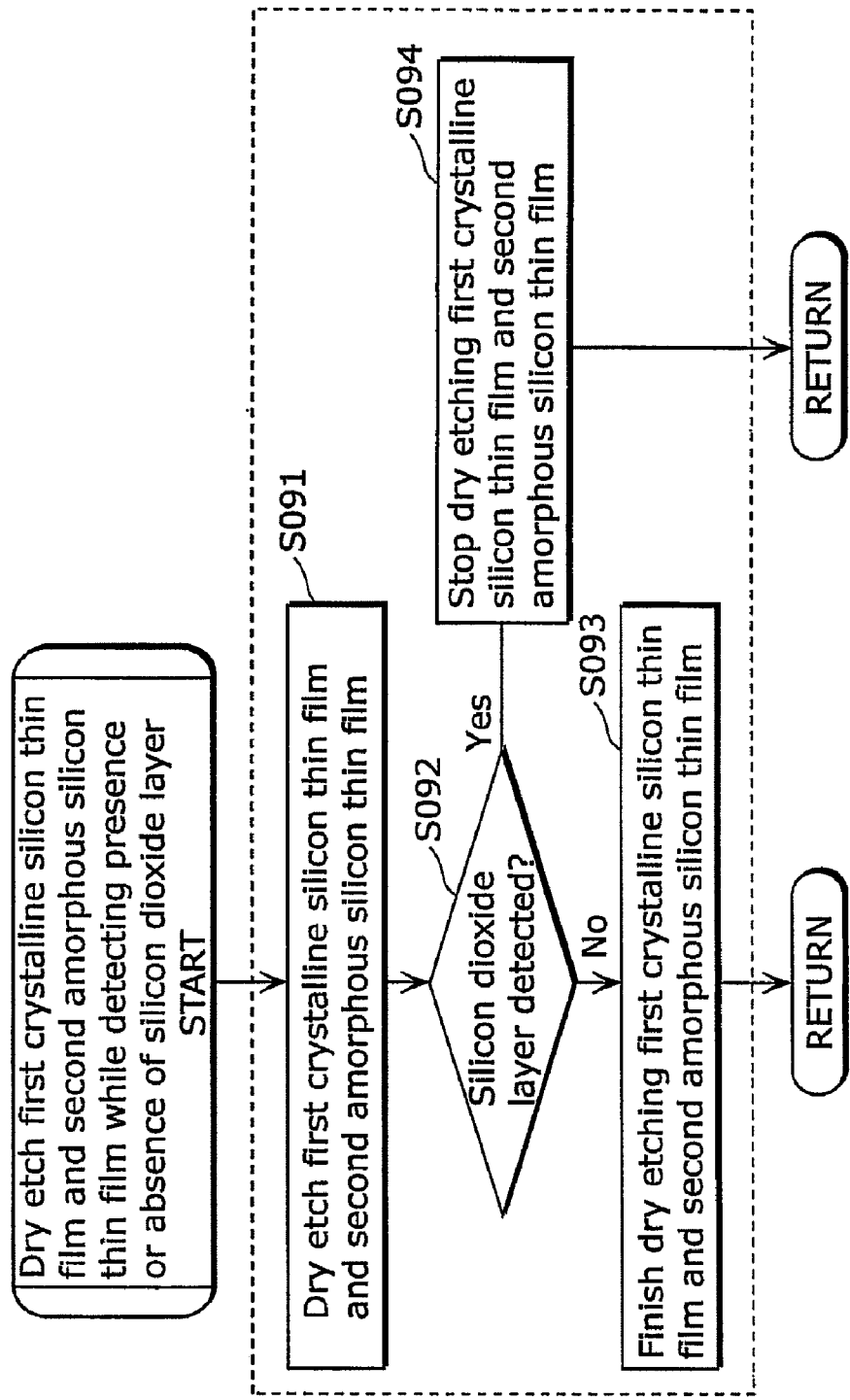
FIG. 6 illustrates a process flowchart of a process S09 in the method of manufacturing the TFT substrate according to the embodiment.

FIG. 6 illustrates the process flowchart of the process S09 in the method of manufacturing the TFT substrate according to the embodiment.

First, the semiconductor layers 15 and 16 are dry etched as described above (S091). When no silicon oxide layer is detected in the boundary between the semiconductor layers 15 and 16 during the dry etching (No at S092), the semiconductor layers 15 and 16 are etched until the surface of the gate insulating film 13 is exposed, and the insular etching is completed (S093). Then, the in-process TFT substrate on which the semiconductor layers 15 and 16 are insularly etched proceeds to processes S10 to S12 in FIG. 5 to be described later.

On the other hand, when the silicon oxide layer is detected in the boundary during the dry etching of the semiconductor layers 15 and 16 (Yes at S092), the dry etching is immediately stopped (S094). Then, the in-process TFT substrate in which the dry etching is stopped is passed to the repairing process (the process S13 or S14 in FIG. 5).

Here, the method of detecting the silicon oxide layer in the boundary will be described.

Figure 7:
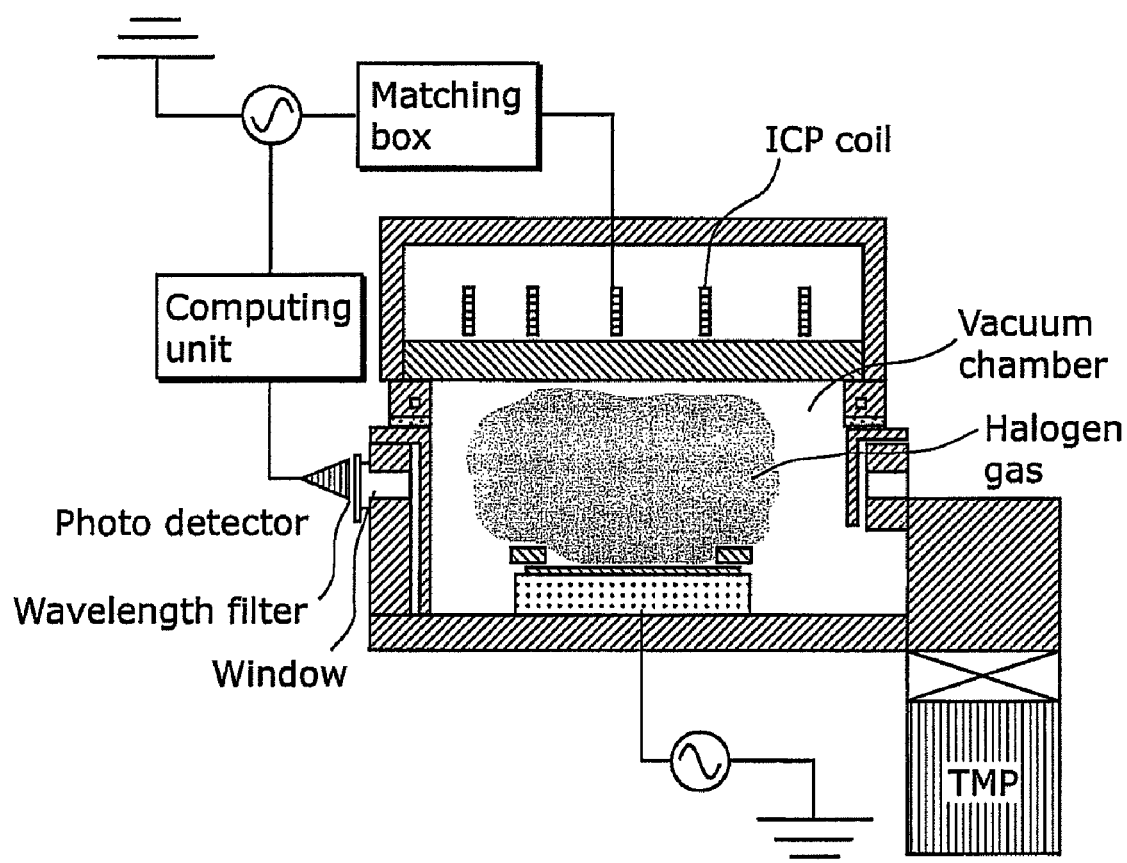
FIG. 7 schematically illustrates a cross-sectional view of a configuration of a dry etching apparatus to be used in the process S09, in the method of manufacturing the TFT substrate according to the embodiment.

FIG. 7 schematically illustrates a cross-sectional view of a configuration of a dry etching apparatus to be used in the process S09, in the method of manufacturing the TFT substrate according to the embodiment. The etching gas including a halogen element is supplied to a vacuum chamber, and plasma is discharged in the vacuum chamber with application of an AC voltage to facing electrodes in the vacuum chamber. The semiconductor layers 15 and 16 that are not covered with the photoresist 17 are etched using the activated halogen element (radicals) by placing the in-process TFT substrate in the vacuum chamber. Here, the activated halogen element has the characteristics of a higher etching rate for amorphous silicon and a lower etching rate for a silicon oxide layer. Thus, since the radicals frequently form polymers with amorphous silicon when the degree of vacuum in the vacuum chamber is maintained constant and the amorphous silicon is etched, abundance of the radicals in the vacuum chamber becomes low. Accordingly, monitoring the abundance of the radicals in the vacuum chamber makes it possible to understand the transition of the etching state from the semiconductor layer 16 made of amorphous silicon to the silicon oxide layer in the boundary.

In the method of manufacturing the TFT substrate according to the embodiment, the abundance of the radicals in the vacuum chamber is detected as the emission intensity of light at a predetermined wavelength. The light is extracted from an emission spectrum of radicals in the etching gas. More specifically, a photo detector detects the emitted light at a predetermined wavelength, through a wavelength filter. The photo detector is, for example, a CCD sensor, and outputs the emission intensity of the radicals to a computing unit as a voltage signal.

The conditions for dry etching the semiconductor layers 15 and 16 include, but not limited to, 100 sccm of the flow rate of chlorine gas, 2 Pa of the degree of vacuum in discharge, the RF frequency of 13.56 MHz, the RF power of 300 W, and the lower electrode bias power of 50 W.

Figure 8:
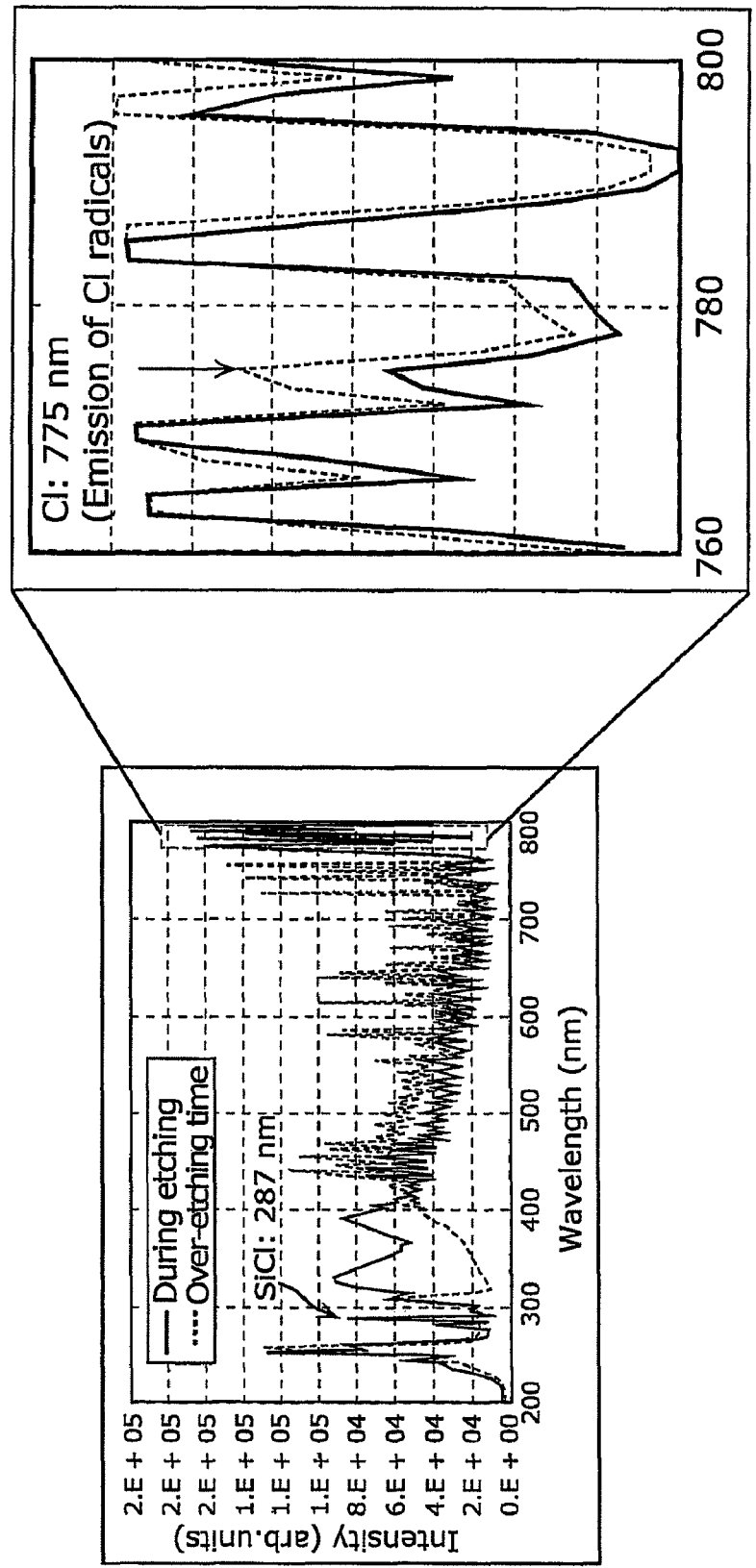
FIG. 8 is a graph representing an emission spectrum of chlorine radicals.

FIG. 8 is a graph representing the emission spectrum of chlorine radicals. In the graph, the solid line represents the emission spectrum measured by a spectroscope when the semiconductor layer 16 made of amorphous silicon is etched, and a dotted line represents the emission spectrum measured by the spectroscope when the semiconductor layers 15 and 16 are in an over-eching state after the etching. In other words, the emission spectrum represented by the solid line is an emission spectrum when amorphous silicon is etched, and the emission spectrum represented by the dotted line is an emission spectrum when Si oxide is etched. In order to understand the transition of the etching state from the semiconductor layer 16 to the silicon oxide layer, it is preferred that a wavelength range having a larger difference between the emission intensities of the emission spectrums is identified and the emission intensities of the identified wavelength range are observed. By observing the emission intensities of the identified wavelength range, the presence or absence of the silicon oxide layer in the boundary can be measured with high precision. The enlarged view of FIG. 8 indicates that the difference between the emission intensities of the emission spectrums is larger at a wavelength of 775 nm. In other words, assuming the emission intensity of radicals when Si oxide is etched as a detection signal (S), and the emission intensity of radicals when amorphous silicon is etched as a reference signal (N), the emission intensity of radicals at the wavelength of 775 nm may be a signal having a higher S/N ratio.

Thus, observing the emission intensity of chlorine radicals only at the wavelength of 775 nm having the higher S/N ratio is desired in the process S092 of determining the presence or absence of the silicon oxide layer in the boundary.

Figure 9A:
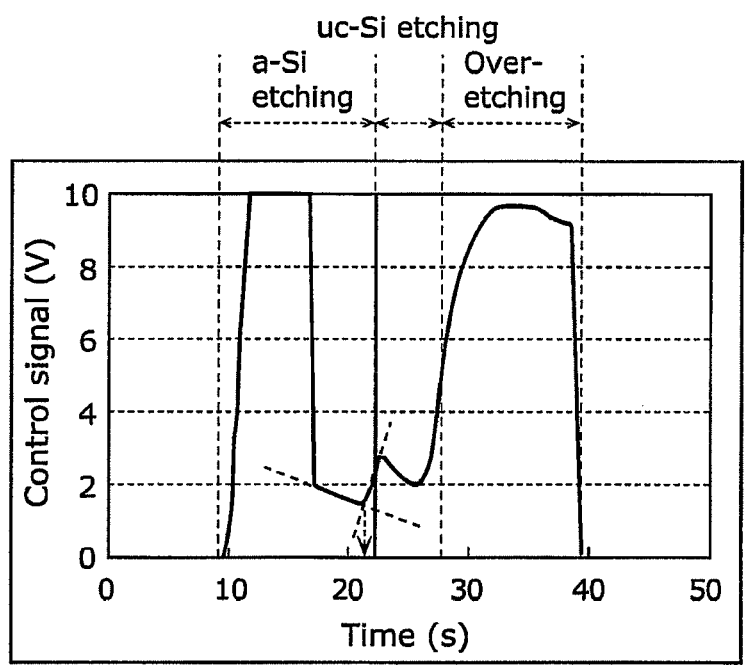
FIG. 9A is a graph representing monitored waveforms when it is checked that the silicon oxide layer remains in the process S09 in the method of manufacturing the TFT substrate according to the embodiment.
Figure 9B:
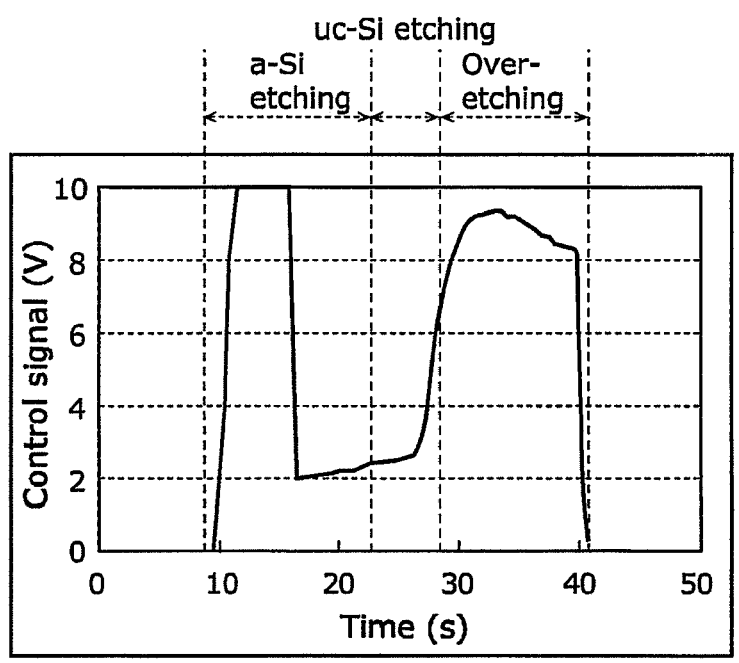
FIG. 9B is a graph representing monitored waveforms when it is checked that no silicon oxide layer remains in the process S09 in the method of manufacturing the TFT substrate according to the embodiment.

FIG. 9A is a graph representing monitored waveforms when it is checked that the silicon oxide layer remains in the process S09 in the method of manufacturing the TFT substrate according to the embodiment. On the other hand, FIG. 9B is a graph representing monitored waveforms when it is checked that no silicon oxide layer remains in the process S09 in the method of manufacturing the TFT substrate according to the embodiment. In both FIGS. 9A and 9B, the horizontal axis represents the transition of the etching period, and the vertical axis represents a control signal that is a voltage signal obtained by converting the emission intensity of radicals at a predetermined wavelength (775 nm). As illustrated in FIG. 9A, a period during which the emission intensity of chlorine radicals at the predetermined wavelength increases is observed between the period during which the semiconductor layer 16 made of amorphous silicon is etched (a-Si etching) and the semiconductor layer 15 made of microcrystalline silicon is etched (uc-Si etching). This indicates that Si oxide exists in the boundary between the semiconductor layers 15 and 16. On the other hand, a period during which the emission intensity of chlorine radicals increases is not observed between the period during which the semiconductor layer 16 is etched (a-Si etching) and the semiconductor layer 15 is etched (uc-Si etching) as illustrated in FIG. 9B. This indicates that no Si oxide exists in the boundary between the semiconductor layers 15 and 16.

As described above, assuming predetermined radicals as radicals to be used for etching amorphous silicon included in plasma for the dry etching process S09, measuring the amount of the predetermined radicals makes it possible to determine the presence or absence of the silicon oxide layer in the boundary between the semiconductor layers 15 and 16 with high precision.

The radicals to be used for the dry etching process S09 preferably include a halogen element. The halogen element has a high etching rate, and the radicals in the halogen element emit light with an emission spectrum of a higher intensity.

Furthermore, it is desired that the halogen element is one of Cl and F.

Furthermore, in the waveform diagram obtained in the dry etching process S09, the presence of the silicon oxide layer in the boundary may be determined when a secondary differential coefficient of the emission intensity during a predetermined period is calculated and the calculated secondary differential coefficient is larger than 0. For example, when a slope of the emission intensity during a predetermined period immediately before a certain time is larger than a slope of the emission intensity during the predetermined period including the certain time (see the dotted line in FIG. 9A), it is determined that the secondary differential coefficient at the certain time is larger than 0. Since the presence of the silicon oxide layer is detected earlier with this method, the dry etching can be stopped when the presence is detected, and the TFT substrate that is being dry etched can be passed to the repairing process earlier. Furthermore, the semiconductor layer 15 included in an in-process TFT substrate to be passed to the repairing process can be prevented from being etched. Since the surface of the semiconductor layer 15 is amorphized when it is etched, the characteristics of the semiconductor layer 15 that functions as a channel layer are degraded, which is not favorable. In such a case, it is necessary to restart from the process S04 of stacking the semiconductor layer 14, after the repairing process S14 in FIG. 5 to be described later.

According to the embodiment, the in-process TFT substrate can be passed to the repairing process without etching the semiconductor layer 15. In such a case, after the repairing process S13 in FIG. 5, the in-process TFT substrate may restart from the re-forming process S06 of stacking the semiconductor layer 16 without re-forming the semiconductor layer 15. Accordingly, the manufacturing processes can be simplified, and the TFT substrate with higher manufacturing yield can be manufactured.

Next, the repairing process performed when the presence of the silicon oxide layer is determined in the boundary between the semiconductor layers 15 and 16, in the process S092 of determining the presence or absence of the silicon oxide layer in the boundary will be described.

Figure 10:
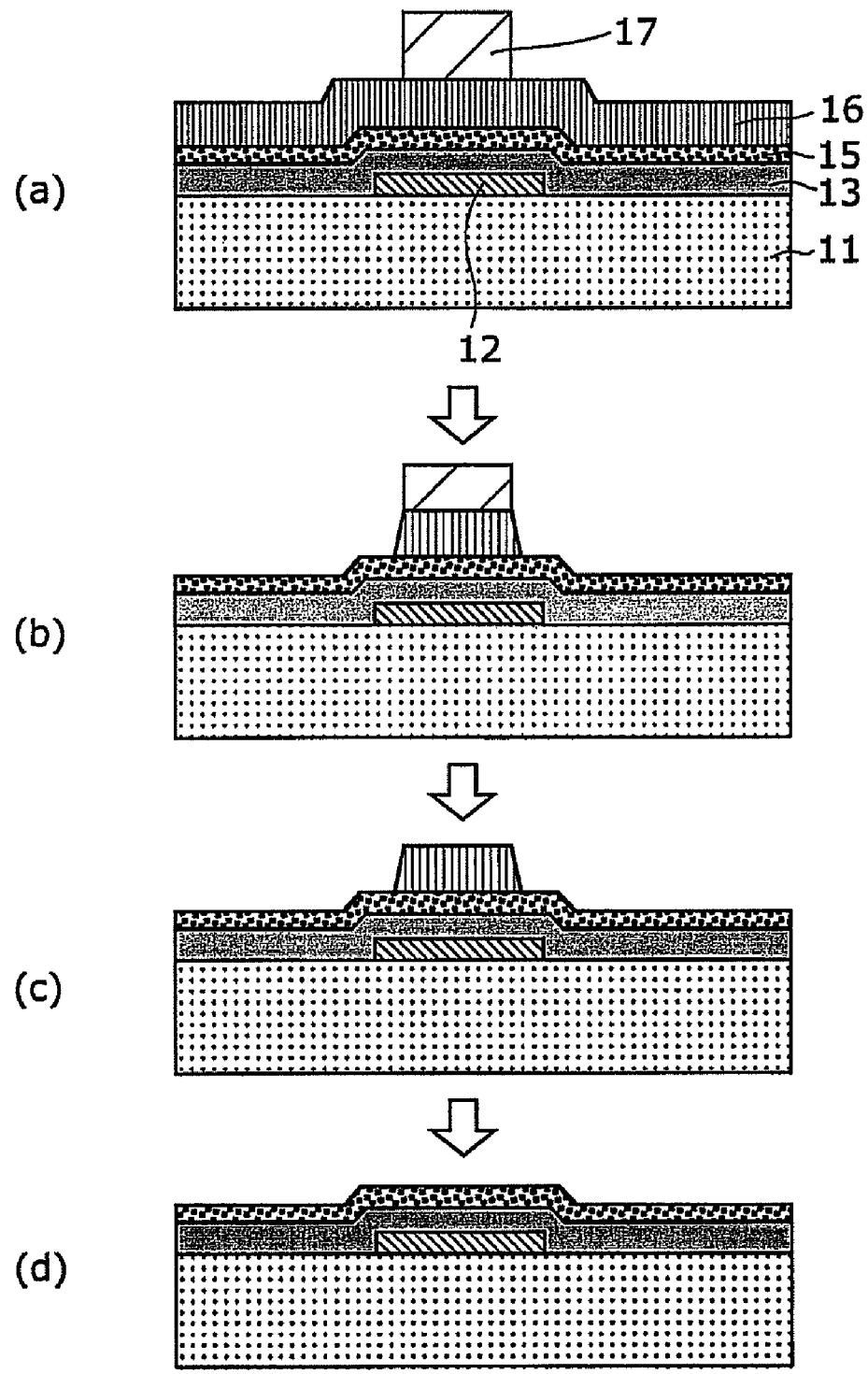
FIG. 10 schematically illustrates a cross-sectional view of a first repairing process in the method of manufacturing the TFT substrate according to the embodiment.

FIG. 10 schematically illustrates a cross-sectional view of first repairing processes in the method of manufacturing the TFT substrate according to the embodiment. The repairing processes in FIG. 10(a) to (d) are processes for modifying the in-process TFT substrate in which the semiconductor layer 16 is being insularly etched into an in-process TFT substrate in which the semiconductor layer 15 has already been stacked, when the presence of the silicon oxide layer in the boundary is determined.

First, when the presence of the silicon oxide layer in the boundary is detected, the insular etching process S09 (FIG. 10(b)) is stopped, and the remaining photoresist 17 is removed (FIG. 10(c)). Accordingly, the semiconductor layer 16 is exposed.

Next, the exposed semiconductor layer 16 is removed (FIG. 10(d)). Accordingly, the semiconductor layer 15 is exposed. In other words, the process S05 is completed by removing the remaining photoresist 17 and the exposed semiconductor layer 16 in the manufacturing processes in FIG. 5. The processes in FIGS. 10(c) and (d) correspond to the repairing 1 in FIG. 5.

Next, the reworked TFT substrate after the repairing process is returned to the process 06, and the processes from S06 to S09 are again performed on the reworked TFT substrate. Then, the processes from S06 to S09 correspond to the returning and performing.

Since the in-process TFT substrate in which the gate electrode 12, the gate insulating film 13, and the semiconductor layer 15 are formed can be reused with one of the repairing processes, the TFT substrate with higher manufacturing yield can be manufactured.

Figure 11:
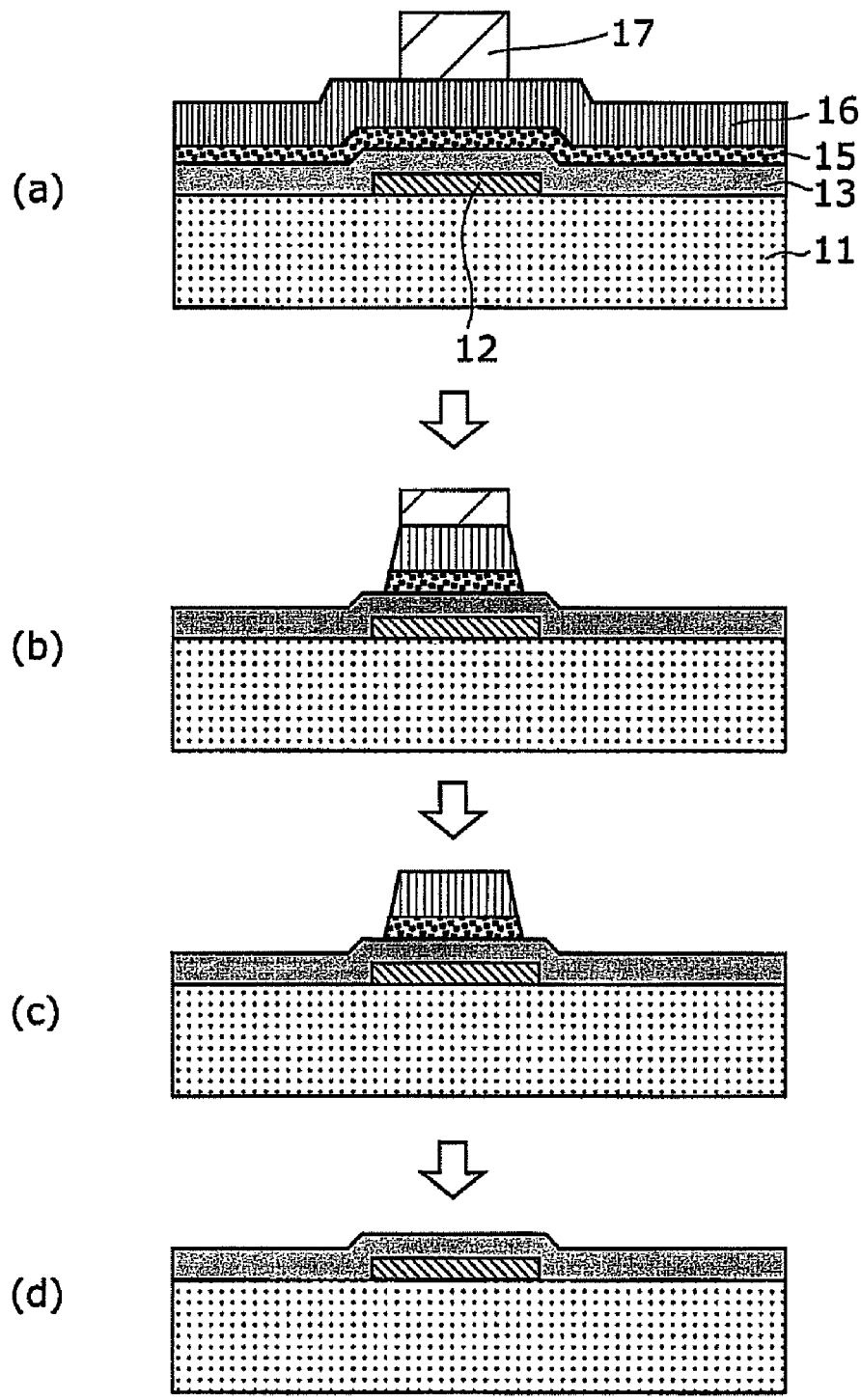
FIG. 11 schematically illustrates a cross-sectional view of a second repairing process in the method of manufacturing the TFT substrate according to the embodiment.

FIG. 11 schematically illustrates a cross-sectional view of second repairing processes in the method of manufacturing the TFT substrate according to the embodiment. The repairing processes in FIG. 11(a) to (d) are processes of modifying the in-process TFT substrate in which the semiconductor layers 15 and 16 are being insularly etched into an in-process TFT substrate in which the gate insulating film 13 has been stacked, when the presence of the silicon oxide layer in the boundary is determined.

First, when the presence of the silicon oxide layer in the boundary is detected, the insular etching process S09 (FIG.

11(*b*)) is stopped, and the remaining photoresist 17 is removed (FIG. 11(*c*)). Accordingly, the semiconductor layer 16 is exposed.

Next, the exposed semiconductor layer 16 is removed. Accordingly, the semiconductor layer 15 is exposed.

Next, the exposed semiconductor layer 15 is removed (FIG. 11(*d*)). Accordingly, the semiconductor layer 13 is exposed. In other words, in the manufacturing processes in FIG. 5, the process S03 is completed. The processes in FIGS. 11(*c*) and (*d*) correspond to the repairing 2 in FIG. 5.

Next, the reworked TFT substrate after the repairing process is returned to the process 04, and the processes from S04 to S09 are again performed on the reworked TFT substrate. Then, the processes from S04 to S09 correspond to the returning and performing.

Since the TFT substrate in which the gate electrode 12 and the gate insulating film 13 are formed can be reused with one of the repairing processes, the TFT substrate with higher manufacturing yield can be manufactured.

One of the first and second repairing processes may be selected in advance, or may be selected in real time during the time when the presence or absence of the silicon oxide layer is observed by the EPM. One of the first and second repairing processes can be selected during the observation by the EPM, for example, according to the time when the presence of the silicon oxide layer is detected and the dry etching is stopped.

Next, the post-processes for the in-process TFT substrate after the processes S01 to S09 will be described.

First, the contact layer 18 is formed so as to cover the gate insulating film 13 and the semiconductor layers 15 and 16 as illustrated in FIG. 3(*c*) (S10). For example, the plasma CVD method is used as a method of forming the contact layer 18.

Next, a metal layer 19*a* to be the pair of source and drain electrodes 19 is formed on the contact layer 18 as illustrated in FIG. 3(*d*). Next, the photoresist 17 is placed on the metal layer 19*a*.

Next, the pair of source and drain electrodes 19 is formed by wet etching the metal layer 19*a* using the photoresist 17 until the surface of the contact layer 18 is exposed as illustrated in FIG. 4(*a*) (S11 in FIG. 5). The metal layer 19*a* is formed by, for example, sputtering. The etching for forming the pair of source and drain electrodes 19 from the metal layer 19*a* may be dry etching.

Next, as illustrated in FIG. 4(*b*), the contact layer 18 that is exposed between the source and drain of the pair of source and drain electrodes 19 and the semiconductor layer 16 under the contact layer 18 are dry etched, and forming of the channel layer is completed (S12 in FIG. 5).

Finally, the passivation film 20 is formed so as to cover the entire of the TFT as illustrated in FIG. 4(*c*). For example, the plasma CVD method is used for forming the passivation film 20.

As described above, the method of manufacturing TFT substrate according to the embodiment is completed.

The channel layer of a TFT includes a stack of the semiconductor layer 15 made of crystalline silicon and the semiconductor layer 16 made of amorphous silicon. With the presence of the silicon oxide layer in the boundary between the layers, charges are accumulated in the silicon oxide layer, and mobility properties and on-characteristics of careers that move the channel layer with the charges are degraded.

According to the method of manufacturing the TFT substrate in the embodiment, the presence or absence of the silicon oxide layer in the boundary is detected by measuring the emission intensity of predetermined radicals in the plasma for dry etching in the process S09. Accordingly, the TFT substrate with the detected silicon oxide layer can be passed to the repairing process for removing the silicon oxide layer.

Furthermore, since the presence or absence of the silicon oxide layer in the boundary can be detected, the state of removing the silicon oxide layer in the process S06 can be determined. As a result, the TFT substrate in which the silicon oxide layer is removed and which includes the high-quality semiconductor layers 15 and 16 can be sorted and the TFT substrate with higher manufacturing yield can be manufactured.

Furthermore, the TFT substrate with the remaining silicon oxide layers is sorted during the process S09 in the manufacturing processes, and the semiconductor layers 15 and 16 are re-formed, so that the TFT substrate including the high-quality semiconductor layers without having the silicon oxide layer can be manufactured. (Application to Organic El Display Devices)

Next, an organic EL display device using a TFT substrate manufactured in the manufacturing method according to the embodiment will be described.

Figure 12:
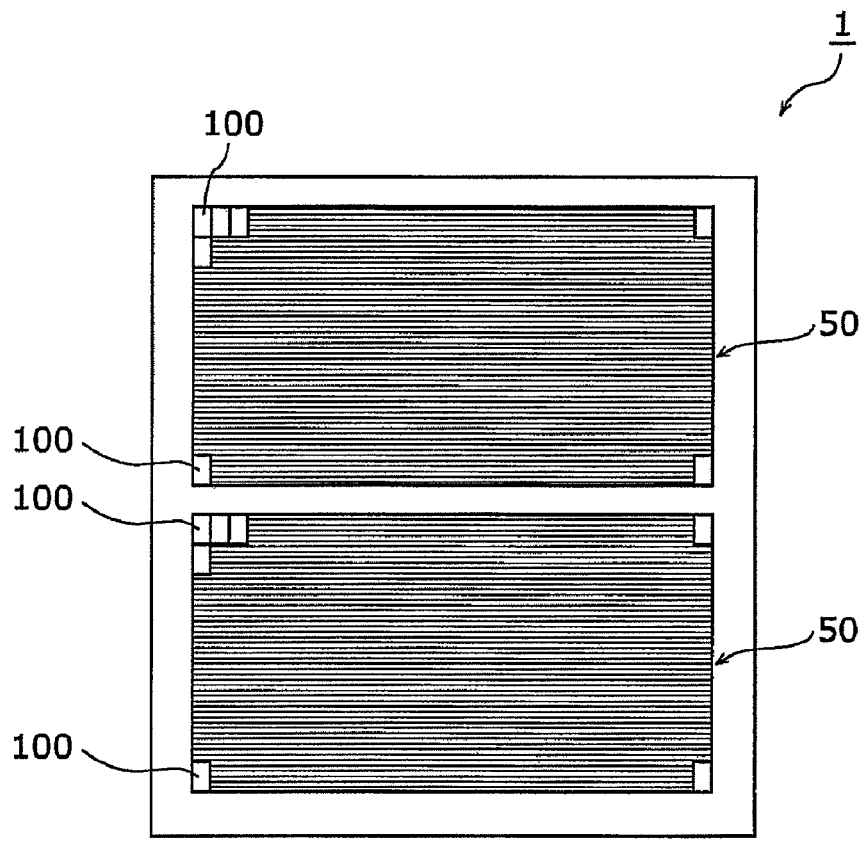
FIG. 12 illustrates a TFT substrate according to the embodiment.
Figure 13:
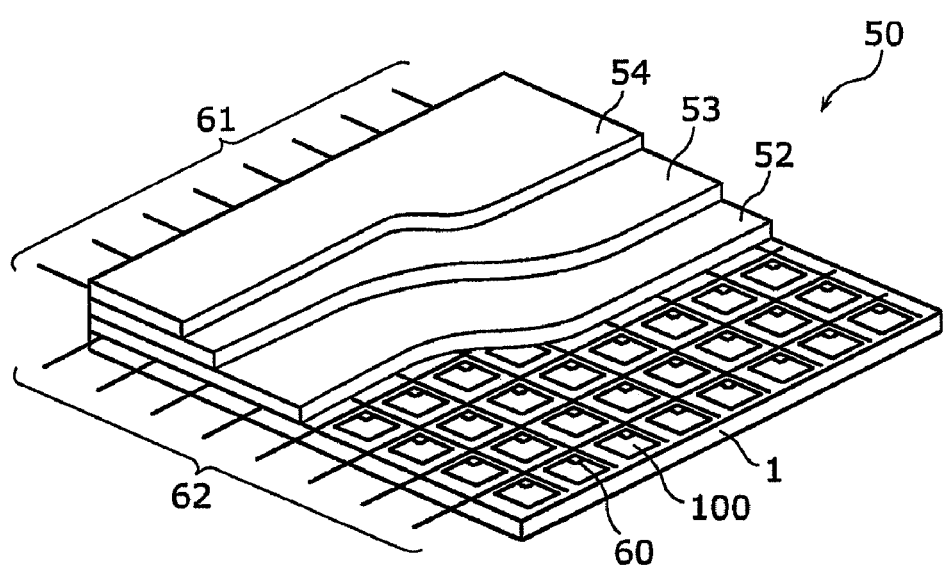
FIG. 13 illustrates a cutaway view of an organic EL display device including the TFT substrate according to the embodiment.
Figure 14:
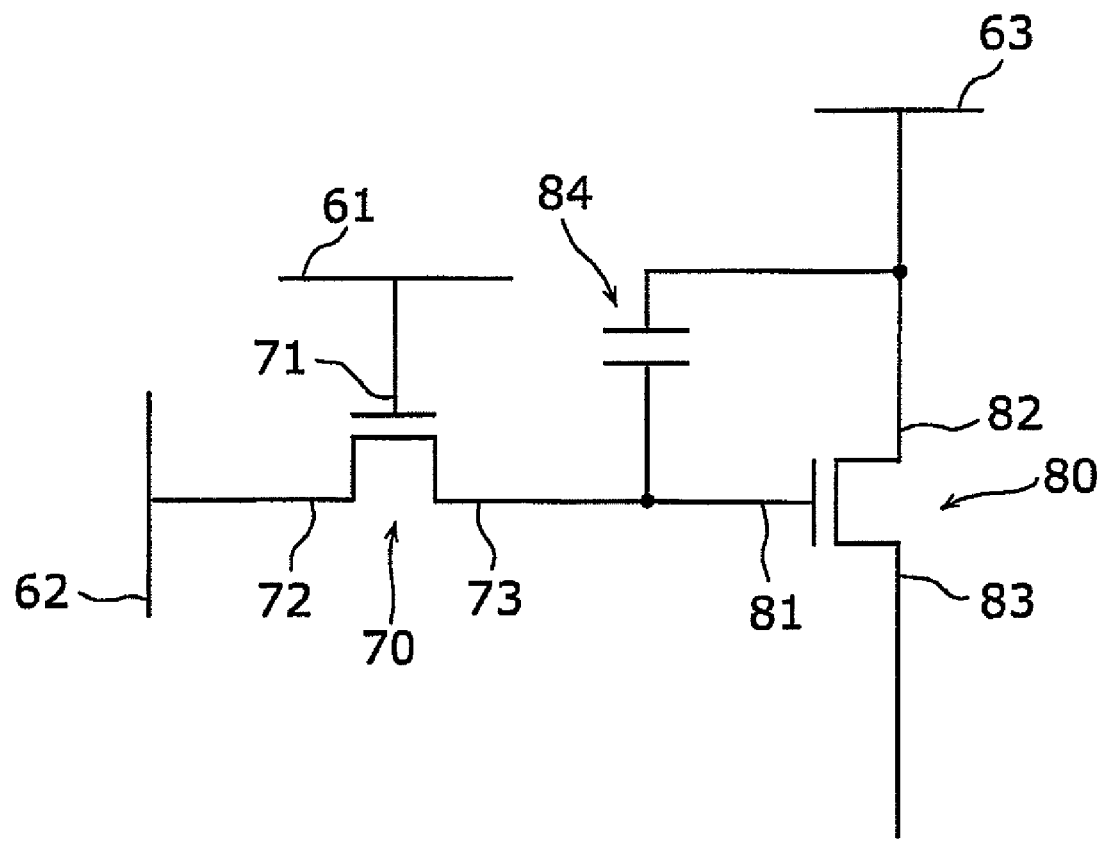
FIG. 14 illustrates a structure of a pixel circuit that drives pixels.

Organic EL display devices 50 having a TFT substrate 1 according to the embodiment will be described with reference to FIGS. 12 to 14. FIG. 12 illustrates the TFT substrate 1 according to the embodiment. FIG. 13 illustrates a cutaway view of the organic EL display device 50 having the TFT substrate 1 according to the embodiment. FIG. 14 illustrates a structure of a pixel circuit that drives pixels.

As illustrated in FIG. 12, the TFT substrate 1 is a constituent element of the organic EL display devices 50 (two in FIG. 12). Furthermore, as illustrated in FIG. 13, each of the organic EL display devices 50 includes a stack of, from the bottom, the TFT substrate 1, a planarized film (illustration is omitted in FIG. 13), an anode 52, an organic EL layer 53, and a transparent cathode 54.

On the TFT substrate 1, pixels 100 are arranged in a matrix of m rows by n columns. Each of the pixels 100 is driven by a corresponding one of pixel circuits 60. Furthermore, the TFT substrate 1 includes gate lines 61 arranged in the rows, source lines 62 that are metal lines arranged in the columns to cross the gate lines 61, and power supply lines 63 (illustration is omitted in FIG. 13) that are metal lines extending in parallel with the source lines 62. Each of the gate lines 61 is connected to a gate electrode 71 (illustration is omitted in FIG. 13) of the first transistor 70 that functions as a switching element included in a corresponding one of the pixel circuits 60, for each of the rows. The first transistor 70 is a TFT with the structure illustrated in FIG. 1, and a field effect transistor (FET). Each of the source lines 62 is connected to a source electrode 72 (illustration is omitted in FIG. 13) of the first transistor 70 that functions as a switching element included in a corresponding one of the pixel circuits 60, for each of the columns. Each of the power supply lines 63 is connected to a drain electrode 82 (illustration is omitted in FIG. 13) of a second transistor 80 that functions as a driving element included in a corresponding one of the pixel circuits 60, for each of the columns. The second transistor 80 is a TFT with the structure illustrated in FIG. 1, and an FET.

Each of the pixel circuits 60 includes the first transistor 70 that functions as the switching element, the second transistor 80 that functions as the driving element, one of the gate lines 61 connected to the gate electrode 71 of the first transistor 70, one of the source lines 62, one of the power supply lines 63, and a capacitor 84 that stores data to be displayed in a corresponding one of the pixels.

The first transistor 70 includes the gate electrode 71 connected to the gate line 61, the source electrode 72 connected to the source line 62, the drain electrode 73 connected to the capacitor 84 and the gate electrode 81 of the second transistor 80, and the semiconductor layers 15 and 16 (illustration is omitted in FIG. 14). With application of a predetermined voltage to the connected gate line 61 and source line 62, the first transistor 70 stores a value of the voltage applied to the source line 62, in the capacitor 84 as display data.

The second transistor 80 includes the gate electrode 81 connected to the drain electrode 73 of the first transistor 70, the drain electrode 82 connected to the power supply line 63 and the capacitor 84, the source electrode 83 connected to the anode 52, and the semiconductor layers 15 and 16 (illustration is omitted in FIG. 14). The second transistor 80 supplies a current corresponding to the voltage value stored in the capacitor 84 from the power supply line 63 to the anode 52 through the source electrode 83.

In other words, each of the organic EL display devices 50 employs an active matrix system that performs display control for 100 pixels each that is located at an intersection between the gate line 61 and the source line 62.

Since no native oxide layer is present in the bilayer structure of the TFT, favorable ohmic characteristics in the channel region are secured. Accordingly, each of the organic EL display devices 50 to which the TFT substrate 1 is applied secures the high display quality with which the point defects on the display caused by the TFT are suppressed.

The above embodiment describes, as an embodiment, repairing the in-process TFT substrate when the presence of a silicon oxide layer is determined in the boundary between the semiconductor layer 15 that is the first crystalline silicon thin film and the semiconductor layer 16 that is the second amorphous silicon thin film.

However, the method of manufacturing the TFT substrate according to the present invention is not limited to the above embodiment including the repairing. In other words, when the presence of a silicon oxide layer is determined in the boundary between the first crystalline silicon thin film and the second amorphous silicon thin film, the TFT substrate after the patterning of the first crystalline silicon thin film and the second amorphous silicon thin film cannot proceed to the subsequent processes.

Furthermore, when the presence of a silicon oxide layer is determined in the boundary between the first crystalline silicon thin film and the second amorphous silicon thin film, manufacturing conditions of at least the forming of a second amorphous silicon thin film and the prior processes may be adjusted as another embodiment of the present invention. The specific examples of adjusting the manufacturing conditions of at least the forming of a second amorphous silicon thin film and the prior processes include adjusting conditions of the hydrogen plasma processing for removing the silicon oxide layer, in the process of removing the silicon oxide layer on the surface of the semiconductor layer 15 (S06 in FIG. 5) as illustrated in FIG. 2(*d*). For example, the RF power or the lower electrode bias power is increased, so that the radical density in hydrogen plasma is increased. Accordingly, the yield of manufacturing a conforming TFT substrate having no silicon oxide layer in the boundary can be improved without passing through the repairing process, and the manufacturing cost can be suppressed.

Furthermore, when the presence of a silicon oxide layer is determined in the boundary between the first crystalline silicon thin film and the second amorphous silicon thin film, the substrate with the silicon oxide layer can be discarded during the manufacturing processes. Accordingly, only the conforming TFT substrate without the silicon oxide layer in the boundary can proceed to the post-processes. As a result, the yield will not be degraded, and the manufacturing cost can be suppressed.

Although the method of manufacturing the TFT substrate according to the present invention is described based on the embodiment, the present invention is not limited to the embodiment. Without departing from the scope of the present invention, the present invention includes an embodiment conceived by a person skilled in the art and having some modifications. Furthermore, the constituent elements of embodiments may be arbitrarily combined within the scope of the present invention.

Although only some exemplary embodiments of the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

Industrial Applicability

The present invention is applicable to manufacturing driving circuit boards of active-matrix display devices, and in particular to manufacturing liquid crystal display devices and organic EL display devices.

What is claimed is:

1. A method of manufacturing a thin-film transistor (TFT) substrate, said method comprising:

preparing a substrate;

forming a gate electrode on the substrate;

forming a gate insulating film on the gate electrode and on a region of the substrate on which the gate electrode is not formed;

forming a first amorphous silicon thin film on the gate insulating film;

modifying the first amorphous silicon thin film into a first crystalline silicon thin film, by crystallizing at least a region of the first amorphous silicon thin film, the region being an upper region of the gate electrode;

removing a silicon oxide layer on a surface of the first crystalline silicon thin film by (i) placing the in-process TFT substrate after said modifying, in a dry etching apparatus and (ii) dry etching the surface of the first crystalline silicon thin film;

forming a second amorphous silicon thin film on the first crystalline silicon thin film;

forming a photoresist on the second amorphous silicon thin film;

patterning the photoresist so that a region of the photoresist corresponding to the upper region of the gate electrode remains; and patterning the first crystalline silicon thin film and the second amorphous silicon thin film by dry etching using, as a mask, the photoresist remaining in said patterning of the photoresist, wherein during the time when the first crystalline silicon thin film and the second amorphous silicon thin film are dry etched in said patterning of the first crystalline silicon thin film and the second amorphous silicon thin film, presence or absence of the silicon oxide layer in a boundary between the first crystalline silicon thin film and the second amorphous silicon thin film is detected by measuring an emission intensity of predetermined radicals in plasma for the dry etching, and (i) when the presence of the silicon oxide layer is detected, it is determined that the in-process TFT substrate after said patterning of the first crystalline silicon thin film and the second amorphous silicon thin film cannot proceed to other processes subsequent to said patterning of the first crystalline silicon thin film and the second amorphous silicon thin film, and (ii) when the absence of the silicon oxide layer is detected, it is determined that the in-process TFT substrate after said patterning of the first crystalline silicon thin film and the second amorphous silicon thin film can proceed to the other processes.

2. The method according to claim 1, further comprising stopping dry etching the first crystalline silicon thin film and the second amorphous silicon thin film, and repairing the in-process TFT substrate, when the presence of the silicon oxide layer is detected in said patterning of the first crystalline silicon thin film and the second amorphous silicon thin film.

3. The method according to claim 2, further comprising returning the in-process TFT substrate to said removing of a silicon oxide layer, and performing again, on the in-process TFT substrate, (i) said removing of a silicon oxide layer, (ii) said forming of a second amorphous silicon thin film, (iii) said forming of a photoresist, (iv) said patterning of the photoresist, and (v) said patterning of the first crystalline silicon thin film and the second amorphous silicon thin film, when the in-process TFT substrate exposes the first crystalline silicon thin film in said repairing, wherein said repairing includes:

removing the photoresist patterned in said patterning of the photoresist so as to expose the second amorphous silicon thin film; and removing the exposed second amorphous silicon thin film so as to expose the first crystalline silicon thin film.

4. The method according to claim 2, further comprising returning the in-process TFT substrate to said forming of a first amorphous silicon thin film, and performing again, on the in-process TFT substrate, (i) said forming of a first amorphous silicon thin film, (ii) said modifying, (iii) said removing of a silicon oxide layer, (iv) said forming of a second amorphous silicon thin film, (v) said forming of a photoresist, and (vi) said patterning of the photoresist, when the in-process TFT substrate exposes the gate insulating film in said repairing, wherein said repairing includes:

removing the photoresist patterned in said patterning of the photoresist so as to expose the second amorphous silicon thin film; and removing the exposed second amorphous silicon thin film and the first crystalline silicon thin film so as to expose the gate insulating film.

5. The method according to claim 1, wherein manufacturing conditions of said forming of a second amorphous silicon thin film and processes prior to said forming of a second amorphous silicon thin film are adjusted, when the presence of the silicon oxide layer is detected in said patterning of the first crystalline silicon thin film and the second amorphous silicon thin film.

6. The method according to claim 1, further comprising discarding the in-process TFT substrate when the presence of the silicon oxide layer is detected in said patterning of the first crystalline silicon thin film and the second amorphous silicon thin film.

7. The method according to claim 1, wherein the predetermined radicals (i) are present in the plasma for the dry etching in said patterning of the first crystalline silicon thin film and the second amorphous silicon thin film and (ii) etch the second amorphous silicon thin film.

8. The method according to claim 7, wherein the predetermined radicals include a halogen element.

9. The method according to claim 8, wherein the halogen element is one of Cl and F.

10. The method according to claim 1, wherein during the dry etching in said patterning of the first crystalline silicon thin film and the second amorphous silicon thin film, an intensity of an emission spectrum of the radicals that (i) are present in the plasma for the dry etching and (ii) etch the second amorphous silicon thin film is measured, a secondary differential coefficient of the intensity of the emission spectrum during a predetermined period is calculated, and the presence of the silicon oxide layer is determined when the calculated secondary differential coefficient is larger than 0.

11. The method according to claim 1, further comprising performing the other processes when the absence of the silicon oxide layer is detected in said patterning of the first crystalline silicon thin film and the second amorphous silicon thin film, wherein the other processes include:

forming a contact layer so as to cover the first crystalline silicon thin film, the second amorphous silicon thin film, and the gate insulating film, the first crystalline silicon thin film and the second amorphous silicon thin film being patterned in said patterning of the first crystalline silicon thin film and the second amorphous silicon thin film;

forming, on the contact layer, a metal layer to be a pair of source and drain electrodes;

placing, on the metal layer, a resist for forming the pair of source and drain electrodes from the metal layer;

forming the pair of source and drain electrodes, by wet etching the metal layer using the resist until a surface of the contact layer is exposed; and dry etching the contact layer and the second amorphous silicon thin film between the pair of source and drain electrodes.

* * * * *